United States Patent [19]

Gill

[11] Patent Number: 5,793,207

[45] Date of Patent: Aug. 11, 1998

[54] DISK DRIVE WITH A THERMAL ASPERITY REDUCTION CIRCUITRY USING A SPIN VALVE SENSOR

[75] Inventor: Hardayal Singh Gill, Portola Valley, Calif.

[73] Assignee: International Business Machines Corporation, Armonk, N.Y.

[21] Appl. No.: 729,253

[22] Filed: Oct. 9, 1996

[51] Int. Cl.[6] ............................. H01L 43/00; G11B 5/127; G01R 33/02; H01F 1/00
[52] U.S. Cl. ........................ 324/252; 338/32 R; 360/113; 428/611
[58] Field of Search ............................. 324/252, 207.21, 324/207.12, 225; 360/113; 338/32 R; 428/611; 251/421, 425

[56] References Cited

U.S. PATENT DOCUMENTS

5,233,482   8/1993   Galbraith et al. ...................... 360/46

*Primary Examiner*—Walter E. Snow
*Attorney, Agent, or Firm*—Paik Saber

[57] ABSTRACT

A disk drive system having a spin valve (SV) magnetoresistive (MR) sensor having four leads, two leads for providing sense current to an SV element and two leads for providing current to an asperity compensation layer (ACL). The SV element as well as the hard bias layers are electrically insulated from the ACL by an antiferromagnetic layer made of an insulating material. The voltages developed across the SV element (voltages due to the presence of thermal asperities and voltages due to the presence of data fields) and the ACL (voltages due to the presence of thermal asperities) are applied to the inputs of a differential amplifier for substantial elimination of the thermal asperity signal.

26 Claims, 6 Drawing Sheets

DISK DRIVE WITH A THERMAL ASPERITY REDUCTION CIRCUITRY USING A SPIN VALVE SENSOR

BACKGROUND OF THE INVENTION

1. Technical Field

This invention relates in general to a direct access storage device (DASD) of the type utilizing magnetoresistive read sensors for reading signals recorded in a magnetic medium and, more particularly, it relates to a DASD having a novel spin valve sensor for minimizing the effect of thermal asperities.

2. Description of the Background Art

Computers often include auxiliary memory storage devices having media on which data can be written and from which data can be read for later use. A direct access storage device (disk drive) incorporating rotating magnetic disks are commonly used for storing data in magnetic form on the disk surfaces. Data is recorded on concentric, radially spaced information tracks on the disk surfaces. Magnetic heads including read sensors are then used to read data from the tracks on the disk surfaces.

In high capacity disk drives, magnetoresistive read sensors, commonly referred to as MR heads, are the prevailing read sensor because of their capability to read data from a surface of a disk at greater linear densities than thin film inductive heads. An MR sensor detects a magnetic field through the change in the resistance of its MR sensing layer (also referred to as an "MR element") as a function of the strength and direction of the magnetic flux being sensed by the MR layer.

One type of MR sensors currently under development is giant magnetoresistive (GMR) sensors manifesting the GMR effect. In the GMR sensors, the resistance of the MR sensing layer varies as a function of the spin-dependent transmission of the conduction electrons between the magnetic layers separated by a non-magnetic layer (spacer) and the accompanying spin-dependent scattering which takes place at the interface of the magnetic and non-magnetic layers and within the magnetic layers.

Figure 1:
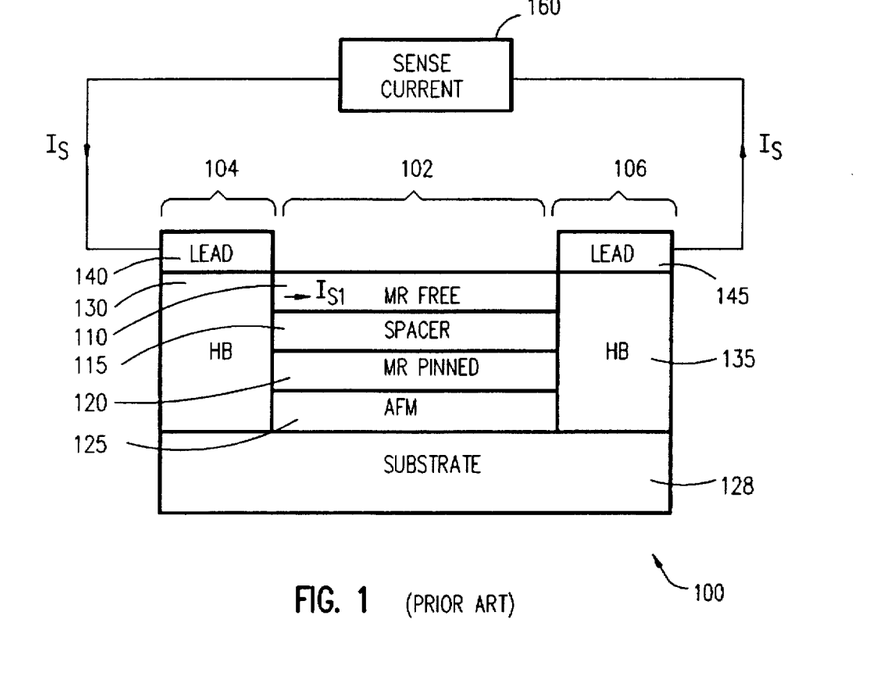
FIG. 1 is a perspective view of a prior art SV sensor.

GMR sensors using only two layers of ferromagnetic material (e.g., NiFe or Co or NiFeCo or NiFe/Co) separated by a layer of non-magnetic metallic material (copper) are generally referred to as spin valve (SV) sensors. In an SV sensor, one of the ferromagnetic layers, referred to as the pinned layer, has its magnetization typically pinned by exchange coupling with an antiferromagnetic (e.g., NiO or FeMn) layer. The pinning field generated by the antiferromagnetic layer is usually several hundred Oersteds so that the magnetization direction of the pinned layer remains fixed during the application of external fields (e.g., fields from bits recorded on the disk). The magnetization of the other layer, referred to as the free layer, however, is not fixed and is free to rotate in response to the field from the disk. FIG. 1 shows a prior art SV sensor having a free layer (also referred to as free MR layer) separated from a pinned layer (also referred to as pinned MR layer) by a nonmagnetic electrically-conducting spacer layer and further having an antiferromagnetic layer for pinning the pinned layer.

The GMR effect, i.e., the net change in resistance, exhibited by a typical prior art SV sensor is about 3% to 4%. U.S. Pat. No. 5,206,590 entitled "Magnetoresistive Sensor Based On The Spin Valve Effect", granted to Dieny et al. on Apr. 27, 1993, discloses an MR sensor operating on the basis of the spin valve effect.

Referring back to FIG. 1, there is shown a prior art SV sensor 100 comprising end regions 104 and 106 separated by a central region 102. A free layer 110 is separated from a pinned layer 120 by a non-magnetic, electrically conducting spacer 115. The magnetization of the pinned layer 120 is fixed by an antiferromagnetic layer 125. Free layer 110, spacer 115, pinned layer 120 and the AFM 125 are all formed in the central region 102. Hard bias layers 130 and 135 formed in the end regions 104 and 106, respectively, provide longitudinal bias for the MR free layer 110 and the pinned layer 120. Leads 140 and 145 formed over hard bias layers 130 and 135, respectively, provide electrical connections for the flow of the sensing current $I_s$ from a current source 160 to the MR sensor 100.

As mentioned earlier, an MR sensor exhibits a change in resistance when in the presence of a changing magnetic field. This resistance change is transformed into a voltage signal by passing a constant sense current through the MR element. The value of the DC voltage for a given MR sensor is the product of the constant sense current and the total resistance between the MR sensor leads. Since the change in the resistance is the principal upon which the MR sensor operates, the change in resistance can substantially effect the performance of the MR sensor and the disk drive incorporating the MR sensor.

A phenomena, known as thermal asperity (TA), can suddenly increase the MR sensor temperature by more than 100 degrees C. The cause of this sudden temperature rise is a collision or near collision of the MR sensor with a protrusion on the disk surface while reading information from a track. The collision causes the DC base voltage of the MR sensor to shift substantially thus making the information unreadable.

Figure 2:
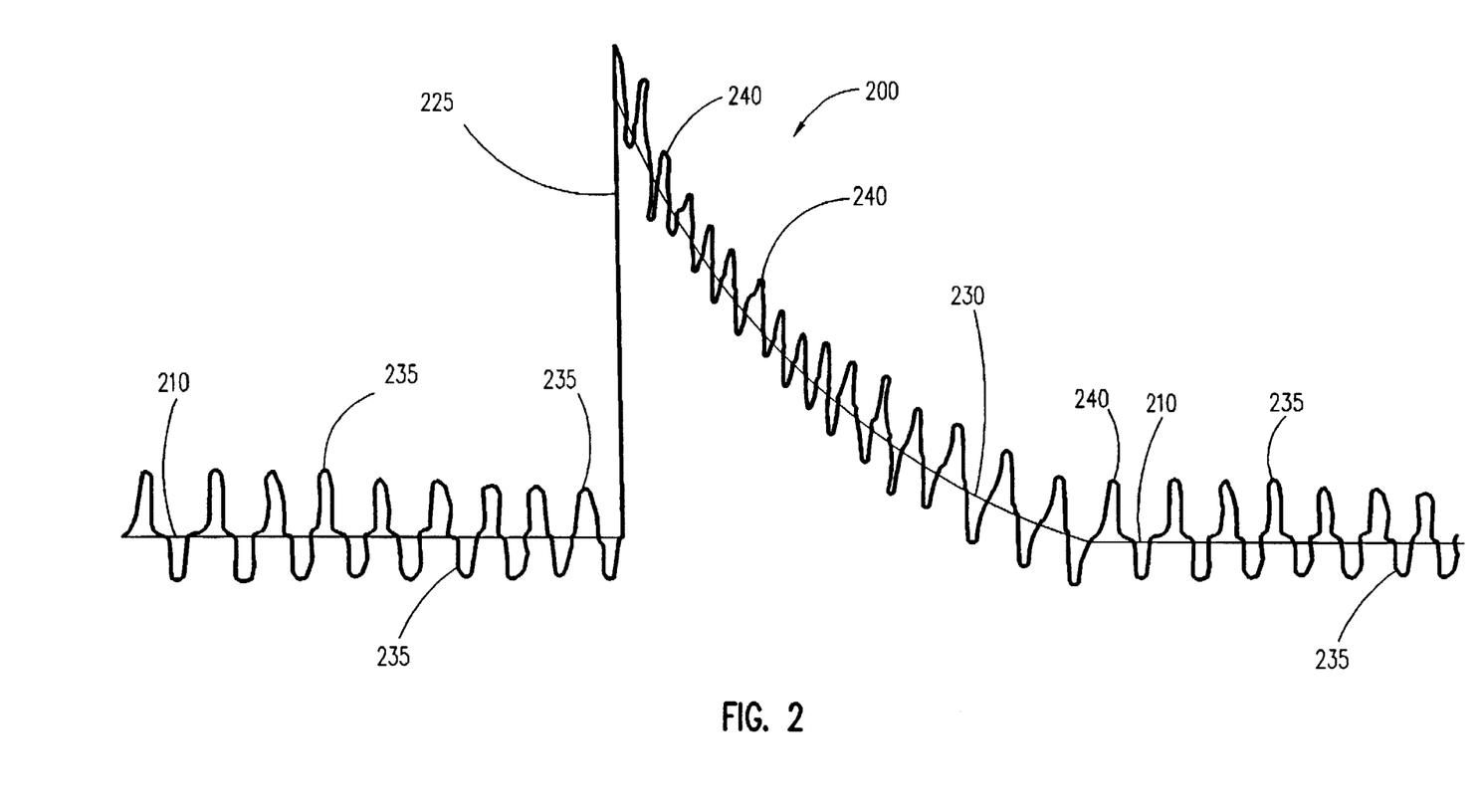
FIG. 2 is a graph showing a thermal asperity signal and the data signal read back from a track.

FIG. 2 is a graph illustrating DC base (bias) voltage 210, thermal asperity voltage 220, which is the shift in the base DC voltage 210, and data signal 235 read back from the disk in the absence of the thermal asperity 220 and data signal 240 read back from the disk in the presence of the thermal asperity 220. Note that the thermal asperity 220 comprises a sudden shift 225 in the DC base voltage followed by an exponential decay 230 in the DC base voltage. The exponential decay 230 in the DC base voltage continues until the DC base voltage 210 is reached. It should be noted that the sudden shift 225 in the DC base voltage could be several times larger than the data signal 235 causing the electrical circuitry connected directly or indirectly to the MR sensor to saturate leading to the loss of the data. The loss of the data, depending on the size of the thermal asperity 220, could very easily be several bytes long, each byte being eight bits long.

Known arrangements in disk drives for minimizing the effect of thermal asperity on the read data utilize either a separate asperity reduction circuit (ARC) module which is costly or a complicated data channel (such as modified partial-response maximum likelihood channel) having a normal operating mode and an asperity recovery mode. Therefore, there is a need for an invention that minimizes the effect of thermal asperities without utilizing a complicated recording channel or a separate ARC module.

SUMMARY OF THE INVENTION

It is an object of the present invention to disclose a method and means for detecting and substantially eliminating the thermal asperity phenomena in disk drives utilizing spin valve magnetoresistive read sensors.

This and other objects and advantages are attained in accordance with the principles of the present invention by a spin valve (SV) sensor having end regions separated from each other by a central region. The SV sensor further has a free layer separated from a pinned layer by a spacer. The free layer, the spacer and the pinned layer are all formed in the central region and are referred to as the SV element. Hard bias (HB) layers formed in the end regions provide longitudinal biasing for the free layer formed in the central region. Each hard bias layer further forms a contiguous junction with the SV element. The SV element and the HB layers are referred to as the SV structure.

The SV sensor further has four leads, two leads (first and second SV leads, also referred to as SV leads) for providing sense current to the free layer and two leads (first and second asperity compensation layer leads, also referred to as ACL leads) for providing current to an asperity compensation layer. Asperity compensation (reduction) layer is preferably a magnetic layer made of the same material as the SV element (NiFe, NiFe/Cu or NiFe/Co) to ensure matching thermal coefficient between the two layers. Alternatively, ACL may be made of non-magnetic electrically conducting material having substantially similar thermal coefficient as the free layer such as copper or tantalum.

The pinned MR layer and the ACL (if ACL is made of magnetic material) have their respective magnetization vectors preferably fixed in the transverse direction (i.e., perpendicular to air bearing surface) as a result of an exchange coupling with an antiferromagnetic (AFM) layer disposed between them. If ACL is made of non-magnetic material, then only the pinned MR layer's magnetization is fixed by the AFM layer. Furthermore, the MR layers (free and pinned layers) formed in the central region as well as the hard bias layers formed in the end regions are electrically insulated from the asperity compensation layer (ACL) by an electrical insulator. In the preferred embodiment of the present invention, the AFM layer is also the insulating layer.

Under DC conditions, the product of the SV element resistance ($1/R_{SV}=1/R_{free}=1/R_{spacer}+1/R_{pinned}$) and the current flowing in the SV element $I_{MR}$ are chosen to be equal to the product of the ACL resistance and the current flowing in the ACL ($R_{ACL}*I_{ACL}$). The voltage developed across the MR leads is fed into the first input terminal of a differential circuit and the voltage developed across the ACL leads is fed into the second input terminal of the differential circuit. The differential circuit further has an output terminal and a ground (common) terminal.

In the presence of a thermal asperity, the resistance of both the SV element and the ACL change are substantially equal thus causing the thermal asperity signal to be developed across the MR leads and the ACL leads and consequently fed into the first and second terminals of the differential circuit. However, in the presence of a data field from the disk, only the resistance of the MR free layer changes since the MR free layer is electrically insulated from the ACL and the ACL magnetization is fixed by the AFM layer. Therefore, the voltage due to the data written onto a disk would be developed only across the MR leads which in turn is fed into the first input terminal of the differential circuit.

Since the thermal asperity signal is present and common at both input terminals of the differential circuit, it will be canceled by the differential circuit and only the data signal present at the first input terminal will be detected and propagated by the differential circuit.

BRIEF DESCRIPTION OF THE DRAWINGS

For a fuller understanding of the nature and advantages of the present invention, as well as the preferred mode of use, reference should be made to the following detailed description read in conjunction with the accompanying drawings. In the following drawings, like reference numerals designate like or similar parts throughout the drawings.

BEST MODE FOR CARRYING OUT THE INVENTION

The following description is the best mode presently contemplated for carrying out the invention. This description and the number of alternative embodiments shown are made for the purpose of illustrating the general principle of the present invention and is not meant to limit the inventive concepts claimed herein.

Figure 3:
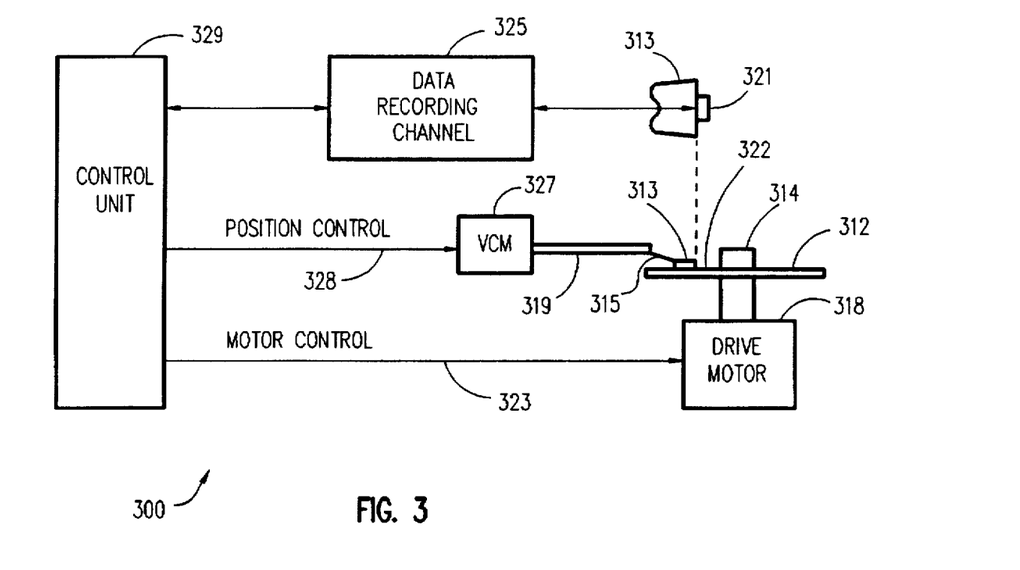
FIG. 3 is a simplified diagram of a magnetic disk storage system embodying the present invention.

Referring now to FIG. 3, there is shown a disk drive 300 embodying the present invention. As shown in FIG. 3, at least one rotatable magnetic disk 312 is supported on a spindle 314 and rotated by a disk drive motor 318. The magnetic recording media on each disk is in the form of an annular pattern of concentric data tracks (not shown) on disk 312.

At least one slider 313 is positioned on the disk 312, each slider 313 supporting one or more magnetic read/write heads 321 where the head 321 incorporates the MR sensor of the present invention. As the disks rotate, slider 313 is moved radially in and out over disk surface 322 so that heads 321 may access different portions of the disk where desired data is recorded. Each slider 313 is attached to an actuator arm 319 by means of a suspension 315. The suspension 315 provides a slight spring force which biases slider 313 against the disk surface 322. Each actuator arm 319 is attached to an actuator means 327. The actuator means as shown in FIG. 3 may be a voice coil motor (VCM). The VCM comprises a coil movable within a fixed magnetic field, the direction and speed of the coil movements being controlled by the motor current signals supplied by controller 329.

During operation of the disk storage system, the rotation of disk 312 generates an air bearing between slider 313 and disk surface 322 which exerts an upward force or lift on the slider. The air bearing thus counter-balances the slight spring force of suspension 315 and supports slider 313 off and slightly above the disk surface by a small, substantially constant spacing during normal operation.

The various components of the disk storage system are controlled in operation by control signals generated by control unit 329, such as access control signals and internal clock signals. Typically, control unit 329 comprises logic control circuits, storage means and a microprocessor. The control unit 329 generates control signals to control various system operations such as drive motor control signals on line 323 and head position and seek control signals on line 328. The control signals on line 328 provide the desired current profiles to optimally move and position slider 313 to the desired data track on disk 312. Read and write signals are communicated to and from read/write heads 321 by means of recording channel 325.

The above description of a typical magnetic disk storage system, and the accompanying illustration of FIG. 3 are for representation purposes only. It should be apparent that disk storage systems may contain a large number of disks and actuators, and each actuator may support a number of sliders.

Figure 4A:
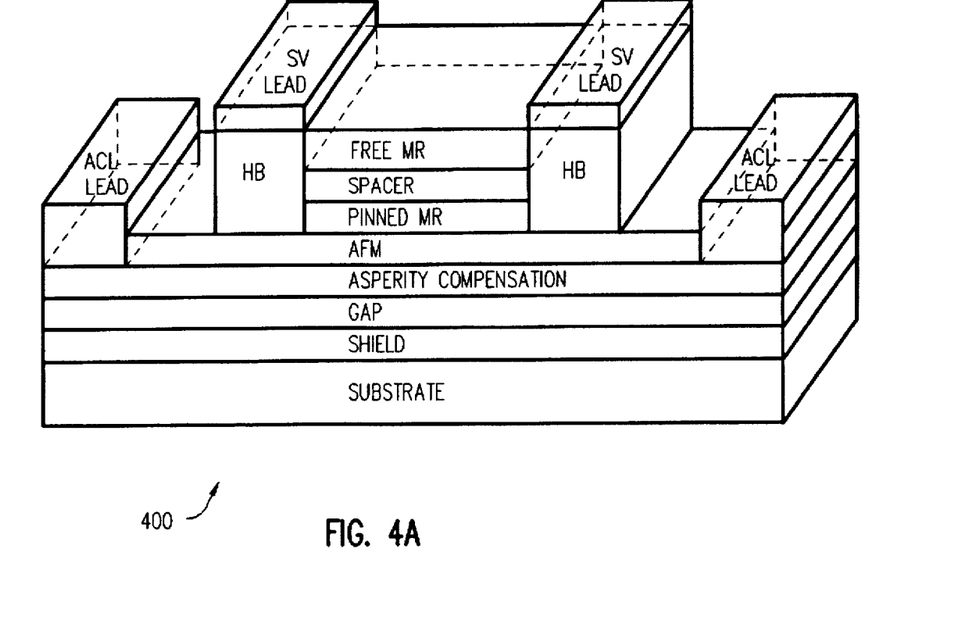
FIGS. 4A and 4B are perspective and air bearing surface views, not to scale, of the SV sensor of the preferred embodiment of the present invention.
Figure 4B:
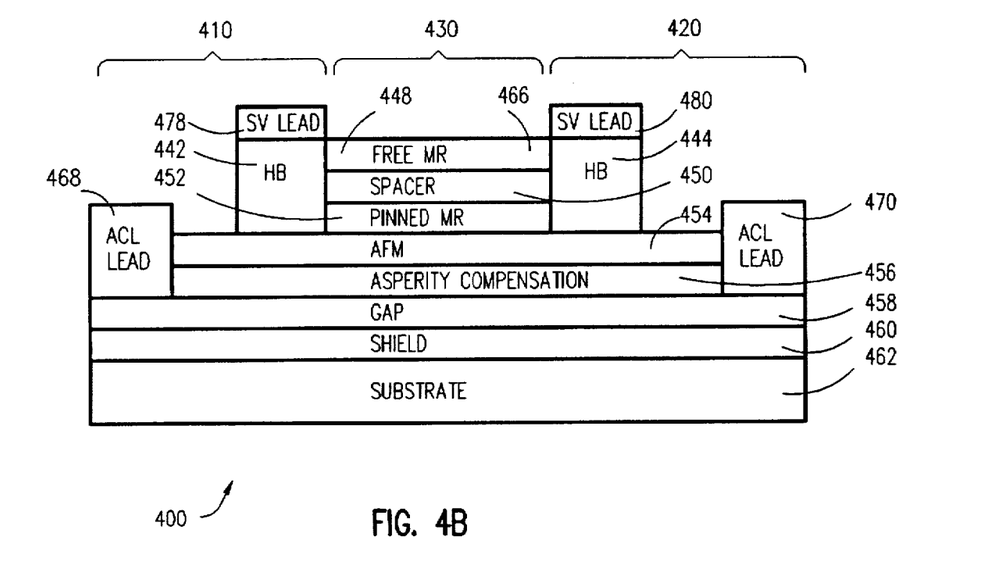

Now referring to FIGS. 4A and 4B, there is shown a perspective view and an air bearing surface view, not to scale, of a spin valve (SV) sensor 400 of the preferred embodiment of the present invention. SV sensor 400 comprises passive end regions 410 and 420 separated by a central active region 430. A magnetic shield layer 460 and a gap layer 458 are preferably, although not necessarily, formed on a suitable substrate 462. Shield layer 460 provides magnetic insulation for the SV sensor 400 and is typically made of NiFe or sendust (TM). Gap layer 458 provides electrical insulation for the SV sensor 400 and is generally made of $Al_2O_3$ or $SiO_2$. After forming the gap layer 458, an asperity compensation layer (ACL) 456 and an antiferromagnetic (AFM) layer 454 are also formed on the gap layer. AFM layer 454 is used to fix the magnetization of the ACL 456 in a fixed direction. AFM layer 454 is preferably made of NiO which is also an insulator to ensure that the thermal coefficient of the AFM 454 does not effect the shape of the thermal asperity signal detected by the ACL 456. The ACL 456 is preferably made of NiFe and in the preferred embodiment of the present invention, the ACL 456 magnetization is fixed to be perpendicular to the air bearing surface 466 (ABS refers to the surface of the magnetic head, including the SV sensor, adjacent the magnetic disk surface).

The SV sensor 400 further comprises a free layer 448 separated from a pinned layer 452 by a non-magnetic electrically conducting spacer 450. The free layer 448, the spacer 450 and the pinned layer 452 are referred to the SV element and are all formed in the central region 430 over the AFM layer 454. The free layer 448 magnetization is generally set to be parallel to the air bearing surface 466 in the absence of an external field. The free layer 448 is generally made of soft ferromagnetic material, such as NiFe or NiFe/Co and preferably made of NiFe.

Pinned layer 452 magnetization is generally fixed to be perpendicular to the air bearing surface 466 through exchange coupling with the AFM layer 454. The pinned layer 452 is generally made of soft ferromagnetic material, such as NiFe or NiFe/Co and preferably made of NiFe/Co.

Hard bias layers 442 and 444 which are formed in the end regions 410 and 420, respectively, provide a longitudinal bias field to the free layer 448 to ensure a single magnetic domain state in the free layer. Hard bias layers 442 and 444 are preferably made of CoPtCr although they may also be made of CoPtCrTa or $CoPtCrSiO_2$. Hard bias layers 442 and 444 further form contiguous junctions with the SV element (free layer 448, spacer 450 and the pinned layer 452).

Figure 5:
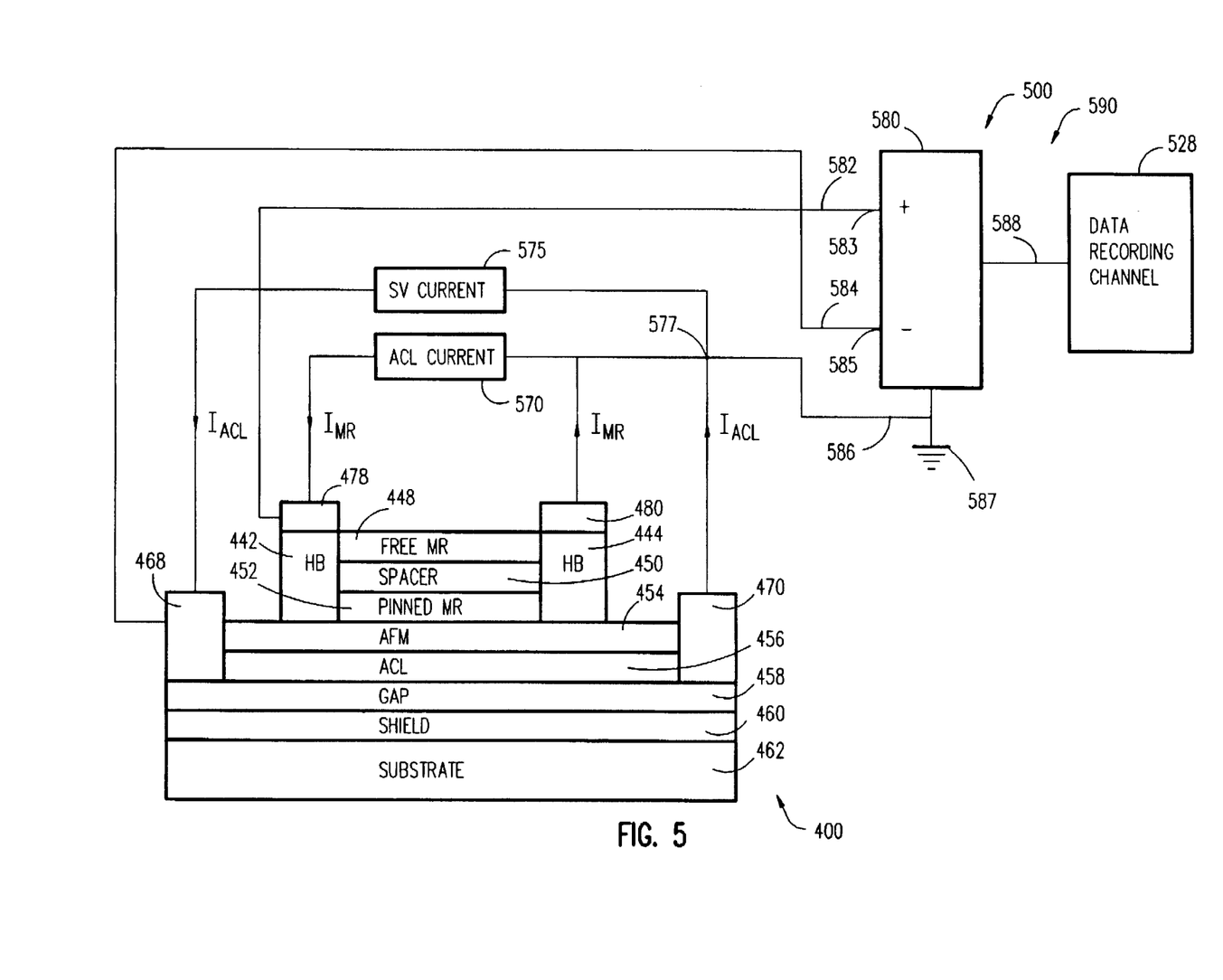
FIG. 5 is a schematic diagram illustrating a thermal asperity reduction method and means according to the preferred embodiment of the present invention.

SV sensor 400 further comprises four electrical leads. Leads 468 and 470 formed in the end regions 410 and 420, respectively, are referred to as the first and second ACL leads and provide electrical connection between the ACL 456 and the ACL current source 570 (FIG. 5). The ACL current source 570 provides current to the ACL 456 (referred to as the ACL current) to establish the DC base (bias) voltage across the ACL 456. Leads 478 and 480 formed in the end regions 410 and 420, respectively, are referred to as the first and second SV leads and provide electrical connection between the SV element and a SV current source 575 (FIG. 5). SV current source 575 provides the necessary sense current to the SV element to establish the DC base (bias) voltage across the SV element.

Note that in the SV sensor 400 of the present invention, the ACL 456 is electrically insulated from the SV element and the hard bias layers 442 and 444. The complete electrical insulation ensures that the current flowing in the SV element, provided by the SV current source 575, is not shunted in anyway by the ACL 456. The electrical insulation between the ACL 456 and the SV element and the hard bias layers 444 and 442 is achieved by the AFM layer 454 made of NiO which is disposed between the ACL 456 and the SV element and the hard bias layers 444 and 442. NiO being an insulator, it insulates the SV structure including the hard bias layers 442 and 444 and the leads 478 and 480 from the ACL 456.

Now referring to FIG. 5, there is shown a schematic diagram of a thermal asperity reduction circuitry 500 according to the preferred embodiment of the present invention. Circuitry 500 comprises SV sensor 400 having first and second SV leads 478 and 480 and first and second ACL leads 468 and 470, the SV current source 575, an ACL current source 570 and a differential circuit 580. The differential circuit 580 includes a first and second input terminals 583 and 585, an output terminal 588 and a ground (reference) terminal 587.

Referring back to FIG. 5, SV leads 478 and 480 are connected to the SV current source 575 which provides the necessary sense current to the SV element (layers 448, 450 and 452) to establish the DC bias voltage across the SV element. ACL leads 468 and 470 are connected to the ACL current source 570 to provide the necessary current to the ACL 456 such that under the bias condition (no external field present), the product of the SV element resistance times the current flowing in the SV element (i.e., the voltage drop across the SV element) is equal to the product of the ACL 456 resistance times the current flowing in the ACL 456 (the voltage drop across the ACL).

In the preferred embodiment of the present invention,

SV element strip height=1 µm;

SV element width=2 µm;

SV element thickness=120 Å;

rho of the SV element=22 µΩcm; and

SV element resistance=36Ω.

Furthermore, in the preferred embodiment of the present invention,

ACL height=1 µm;

ACL layer width=4 µm;

ACL thickness=40 Å;

rho of the ACL=22 µΩcm; and

ACL resistance=220Ω.

In the preferred embodiment of the present invention, the sense current provided by the SV current source 575 is 6 mA which means the ACL current provided by the ACL current source 570 will be set at about 1.0 mA to ensure that under the DC bias condition:

$$R_{SV\ element} * I_{SV\ element} = R_{ACL} * I_{ACL}.$$

Referring back to FIG. 5, first SV lead 478 is also connected, via the wire 582, to the first input terminal 583 of the differential circuit 580 and the first ACL lead 468 is connected, via the wire 584, to the second input terminal 585 of the differential circuit 580. Leads 470 and 480 are preferably connected to a common wiring pad 577. The common pad 577 in turn is connected, via wire 586, to the ground 587 of the differential circuit 580. The output terminal 588 of the differential circuit 580 is then connected to the data recording channel 528 for further processing of the detected signals according to the description of FIG. 3. The recording channel 528 and the differential circuit 580 together are referred to as the recording system 590. Differential circuit 580 is preferably a silicon-based high-speed differential amplifier integrated into the same silicon chip that the data recording channel 528 is integrated into. Differential circuit 580 further has a differential gain such that the output voltage at node 588 due to the difference between the voltages applied to its first and second input terminals 583 and 585 can be expressed in terms of:

$$V_{588} = A*(V_{583} - V_{585})$$

where A is the differential gain of the differential circuit 580.

Figure 6A:
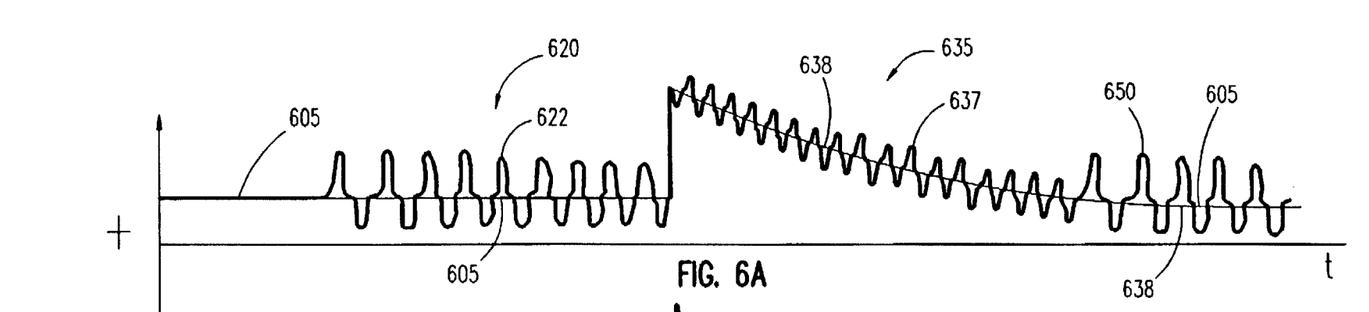
FIGS. 6A, 6B and 6C are graphs illustrating the signals at the input terminals and the output terminal of the differential circuit in the preferred embodiment of the present invention in the absence of thermal asperity and data signal, in the absence of thermal asperity and the presence of data signal and in the presence of thermal asperity and data signal, respectively.
Figure 6B:
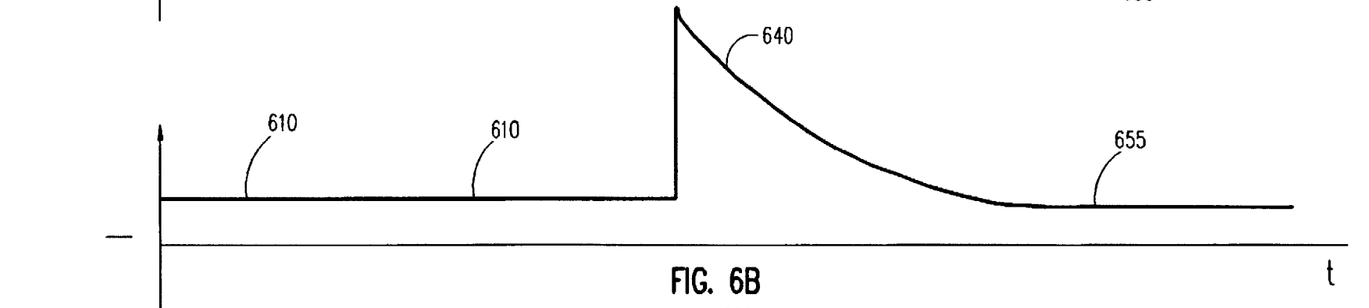
Figure 6C:
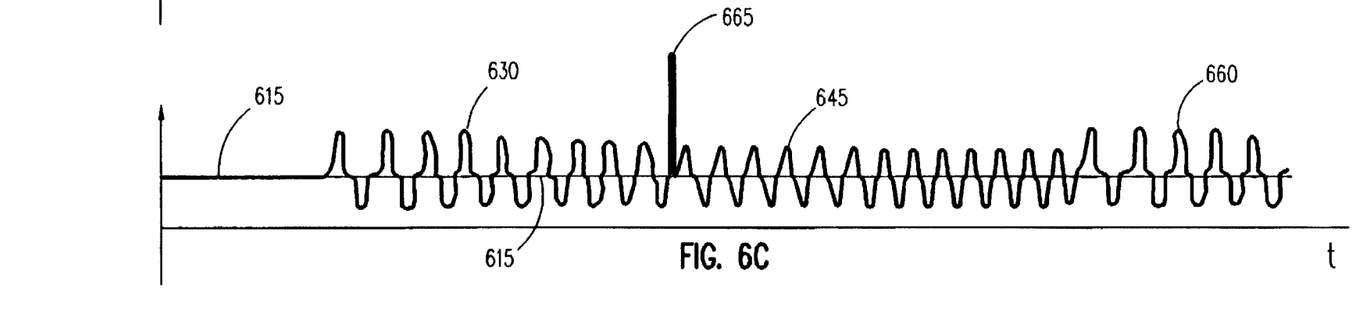

Now referring to FIGS. 6A, 6B, and 6C, there are shown the voltage signals present at the first input terminal 583, the second input terminal 585 and the output terminal 588 of the differential amplifier 580 under DC bias condition, in the presence of data fields from a magnetic disk, and in the presence of a thermal asperity and data fields from the magnetic disk, respectively. Now referring to FIGS. 5 and 6A–6C, under the DC bias condition (no external field is present) the voltage at the first terminal 583 is a DC voltage 605 which is $R_{SV\ element} * I_{SV\ element}$, the voltage at the second terminal 585 is a DC voltage 610 which is $R_{ACL} * I_{ACL}$, and the voltage at the output terminal 588 is a DC voltage 615.

In the presence of a field, such as a data field from a magnetic disk, the voltage across the SV element changes because of the change in the resistance of the free layer 448. The voltage developed across the SV element as a result of the change in the resistance of the free layer 448 in the presence of a data field is represented in a form of an AC signal. Consequently, the voltage signal at the first input terminal 583 which is connected to the first SV lead 478 is voltage 620 which has an AC component 622 and a DC component 605. The AC component, as mentioned above, is due to the change in the resistance of the free layer 448 in the presence of the field from the disk and is:

$$I_{SV\ element} * \Delta R_{SV\ element}$$

and the DC component, as described above, is:

$$I_{SV\ element} * R_{SV\ element}$$

such that:

$$V_{620} = I_{SV\ element} * \Delta R_{SV\ element} + I_{SV\ element} * R_{SV\ element}$$

Referring back to FIG. 5 and FIGS. 6A–C, in the presence of a field from the disk, the voltage across the ACL 456 does not change because ACL 456 is insulated from the SV structure and the hard bias layers 442 and 444 and its magnetization is fixed by the AFM 454. Consequently, the voltage at the second input terminal 585 remains the same as the voltage under the DC bias condition, that is, $$V_{610} = I_{ACL} * R_{ACL}.$$

In the presence of a field from the disk, the voltage at the output terminal 588 will be equal to the difference between the voltage signals at the first and second input terminals 583 and 585 times the differential gain of the circuit 580 as shown below:

$$V_{588} = A*(V_{583} - V_{585})$$

$$V_{630} = A*(V_{620} - V_{610})$$

$$V_{630} = A*(I_{SV\ element} * \Delta R_{SV\ element} + I_{SV\ element} * R_{SV\ element} - I_{ACL} * R_{ACL})$$

Since the resistance and the current flowing in the ACL 456 are chosen such that $I_{SV\ element} * R_{SV\ element} = I_{ACL} * R_{ACL}$, the contribution from the above two signals cancel each other and:

$$V_{630} = A*(I_{SV\ element} * \Delta R_{SV\ element})$$

Now, assume that a thermal asperity phenomenon takes place while reading data from a track of a disk causing the SV sensor 400 temperature to increase. Under such condition, the voltage at the first input terminal 583 would be a voltage 635 which has an AC component 637 and a DC component 638. The AC component is due to the change in the resistance of the free layer 448 in the presence of the field from the disk and is:

$$I_{SV\ element} * \Delta R_{SV\ element}.$$

The DC component 638, which is represented by a sudden shift in the DC voltage followed by an exponential decay in the shifted DC voltage, is:

$$I_{SV\ element} * R_{SV\ element}$$

such that:

$$V_{635} = I_{SV\ element} * \Delta R_{SV\ element} + I_{SV\ element} * R_{SV\ element}$$

In the presence of the thermal asperity, the bias voltage across the ACL 456 also changes because of the sudden change of temperature causing the resistance of the ACL 454 changes. The change in the bias voltage (thermal asperity signal) is represented by a sudden shift in the DC voltage followed by an exponential decay of the shifted voltage. Consequently, the voltage at the second input terminal 585 is:

$$V_{640} = I_{ACL} * R_{ACL}$$

Now, assume that a thermal asperity phenomenon takes place while reading data from a track of a disk. Under this condition, the voltage at the output terminal 588 will be equal to the difference between the voltage signals at the first and second input terminals 583 and 585 times the differential gain of the circuit 580 as shown below:

$$V_{588} = A*(V_{583} - V_{585})$$

$$V_{645} = A*(V_{635} - V_{640})$$

$$V_{645} = A*(I_{SV\ element} * \Delta R_{SV\ element} + I_{SV\ element} * R_{SV\ element} - I_{ACL} * R_{ACL})$$

Since the resistance and the current flowing in the ACL 456 are chosen such that $I_{SV\ element} * R_{SV\ element} = I_{ACL} * R_{ACL}$, and since the free and pinned layers material and the ACL 456 material are chosen to have the same thermal coefficient, the thermal asperity signal developed across the SV element and the ACL layer 456 are substantially of the same shape, magnitude, and phase. Therefore, the terms $I_{SV\ element} * R_{SV\ element}$ and $I_{ACL} * R_{ACL}$ in the above equation cancel each other which means:

$V_{645} = A * (I_{SV\ element} * \Delta R_{SV\ element})$

Note that, in the actual implementation a narrow signal spike 665 is usually present at the output terminal 588 at the onset of the sudden shift in the DC voltage due to finite physical mismatches present between: (1) the resistance of the SV element and the ACL 456, (2) resistance of the SV and ACL leads, (3) ACL current source 570 and the SV current source 575, and (4) internal mismatches of the differential circuit. However, this spike is generally only a few bits long which does not cause loss of data.

Figure 7:
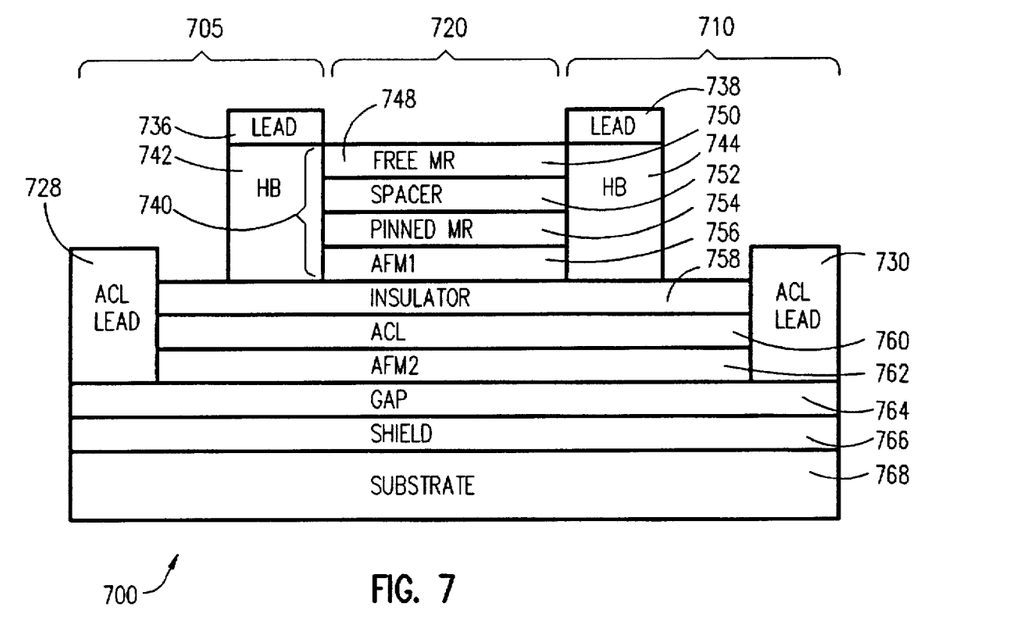
FIG. 7 is an air bearing surface view, not to scale, of an alternative embodiment of the SV sensor of the present invention.

Referring now to FIG. 7, there is shown an air bearing surface view, not to scale, of an AMR sensor 700 of an alternative embodiment of the present invention. AMR sensor 700 comprises passive end regions 705 and 710 separated from each other by a central active region 720. The MR sensor 700 further comprises an SV element 740 formed in the central region 720. SV element 740 comprises a free layer 750 separated from a pinned layer 754 by a non-magnetic electrically conducting spacer 752. SV element further includes an AFM1 layer 756 which fixes the magnetization of the pinned layer 754 perpendicular to the ABS.

The free layer 750 with its magnetization free to rotate under the presence of an external field is generally made of soft ferromagnetic material, such as NiFe or NiFe/Co and preferably made of NiFe. Magnetization of the free layer 750 is generally set to be parallel to the air bearing surface 748 in the absence of an external field.

Hard bias layers 742 and 744 which are formed in the end regions 705 and 710, respectively, provide a longitudinal bias field to the free layer 750 to ensure a single magnetic domain state for the free layer. Hard bias layers 742 and 744 are preferably made of CoPtCr although they may also be made of CoPtCrTa or CoPtCrSiO$_2$. Hard bias layers 742 and 744 further form contiguous junctions with the SV element 740.

MR sensor 700 further comprises a magnetic shield layer 766 and a gap layer 764 which are generally, although not necessarily, formed on a suitable substrate 768. Shield layer 766 provides magnetic insulation for the SV sensor 700 and is typically made of NiFe or sendust (TM). Gap layer 764 provides electrical insulation for the SV sensor 700 and is generally made of Al$_2$O$_3$ or SiO$_2$. After forming the gap layer 764, an antiferromagnetic layer (AFM2) 762, an asperity compensation layer (ACL) 760 and an insulating layer 758 are also formed on the gap layer. AFM2 layer 762 is used to fix the magnetization of the ACL 760 in a fixed direction if ACL 760 is made of magnetic material. AFM2 762 is preferably made of NiO to ensure that the thermal coefficient of the AFM2 762 does not effect the shape of the thermal asperity signal detected by the ACL 760. Alternatively, AFM2 762 may be made of FeMn or NiMn. The asperity compensation layer (ACL) 760 is preferably made of NiFe and its magnetization is fixed to be perpendicular to the air bearing surface 748. Alternatively, the ACL 760 may be made of non-magnetic electrically conducting material having the same or similar thermal coefficient as the SV element such as copper or tantalum. Note that if ACL 760 is made of non-magnetic electrically conducting material, there is no longer any need for AFM layer 762 (AFM2).

MR sensor 700 further comprises four electrical leads. Leads 728 and 730 formed in the end regions 705 and 710, respectively, are referred to as the first and second ACL leads and provide electrical connection between the ACL 756 and an ACL current source (not shown). The ACL current source provides current to the ACL 760 (referred to as the ACL current) to establish the DC base (bias) voltage across the ACL 760. Leads 736 and 738 formed in the end regions 705 and 710, respectively, are referred to as the first and second SV leads and provide electrical connection between the SV element 740 and an SV current source (not shown). SV current source provides the necessary sense current to the SV element to establish the DC base (bias) voltage across the SV element.

Note that in the MR sensor 700 of the present invention, the ACL 760 and the AFM2 762 are electrically insulated from the SV element 740 and the hard bias layers 742 and 744. The complete electrical insulation ensures that the current flowing in the SV element 740, provided by the SV current source, is not shunted in any way by either the ACL 760 or AFM2 762. The electrical insulation between the ACL 760 and the SV element 740 and the hard bias layers 742 and 744 is achieved by a layer of insulating material 758 which is disposed between the ACL 760 and the SV element 740 and the hard bias layers 742 and 744. Insulator 758 is typically made of Al$_2$O$_3$ or SiO$_2$.

It should be further noted that alternative MR sensor 700 comprises two antiferromagnetic layers 762 and 756. AFM2 layer 762 is utilized to fix the magnetization of the asperity compensation layer 760 and the AFM1 layer 756 is used to fix the magnetization of the pinned layer 754.

In the alternative embodiment of the present invention, SV sensor 400 in FIG. 5 is replaced by the alternative SV sensor 700 to provide for thermal asperity detection and reduction utilizing the thermal asperity reduction circuitry 500.

While the present invention has been particularly shown and described with reference to the preferred embodiment thereof, nevertheless, it will be understood by those skilled in the art that various modifications may be made therein without departing from the spirit, scope, and teaching of the present invention.

For example, although the preferred embodiment of the present invention was described in terms of an SV sensor having four leads where two of the leads were shorted together, the invention is equally applicable to an MR sensor having only three leads where one of the leads is the common lead (ground lead) between the SV element and the SAL.

Accordingly, it is to be understood that the invention disclosed herein is not to be limited by the illustrated embodiment, but only by the scope of the appended claims.

I claim:

1. A spin valve (SV) sensor, comprising:
   an SV element, said SV element having:
   a free layer;
   a pinned layer; and
   a spacer layer disposed between said free layer and said pinned layer;

first and second hard bias layers separated from each other by said SV element, said first and second hard bias layers forming a contiguous junction with said SV element;

an insulating antiferromagnetic (AFM) layer for pinning the magnetization of said pinned layer;

an asperity compensation layer (ACL) separated from said SV element and said hard bias layers by said insulating AFM layer;

first and second SV leads disposed over said first and second hard bias layers for providing sense current to said SV element; and first and second ACL leads in contact with said ACL for providing ACL current to said ACL.

2. An SV sensor as recited in claim 1 wherein said free layer is selected from a group of material consisting of NiFe and NiFe/Co.

3. An SV sensor as recited in claim 1 wherein said asperity compensation layer is selected from a group of material consisting of NiFe, NiFe/Co, NiFe/Cu, copper and tantalum.

4. An SV sensor as recited in claim 1 wherein said insulating AFM layer comprises NiO.

5. An SV sensor as recited in claim 1 wherein said first and second hard bias layers are selected from a group of material comprising CoPtCr, CoPtCrTa, and $CoPtCrSiO_2$.

6. An SV sensor as recited in claim 1 wherein said ACL is selected from a group of material consisting of NiFe and NiFe/Co, said insulating AFM further pinning the magnetization of said ACL.

7. A magnetic storage system, comprising:
- a magnetic storage medium for recording data;
- an SV sensor including:
  - an SV element, said SV element having:
    - a free layer;
    - a pinned layer; and
    - a spacer layer disposed between said free layer and said pinned layer;
  - first and second hard bias layers separated from each other by said SV element, each of said hard bias layers forming a contiguous junction with said SV element;
  - an insulating antiferromagnetic (AFM) layer for pinning the magnetization of said pinned layer;
  - an asperity compensation layer (ACL) separated from said SV element and said hard bias layers by said insulating AFM layer;
  - first and second SV leads disposed over said first and second hard bias layers for providing sense current to said SV element; and
  - first and second ACL leads in contact with said ACL for providing ACL current to said ACL; and
- a recording channel coupled to said SV sensor for detecting resistance changes in said SV element responsive to applied magnetic fields representative of data recorded in said magnetic storage medium.

8. A magnetic storage system according to claim 7, wherein said asperity compensation layer is selected from a group of material consisting of NiFe, NiFe/Co, NiFe/Cu, copper and tantalum.

9. A magnetic storage system according to claim 7, wherein said insulating AFM layer comprises NiO.

10. A magnetic storage system according to claim 7, wherein said first and second hard bias layers are selected from a group of material comprising CoPtCr, CoPtCrTa, and CoPtCrSiO2.

11. A magnetic storage system according to claim 7, wherein said recording channel further comprises a differential circuit having first and second input terminals connected to the first SV lead and the first ACL lead for detecting resistance changes in said SV element and said ACL responsive to a thermal asperity phenomena during reading data in said magnetic storage medium.

12. A spin valve (SV) sensor, comprising:
- an SV element, said SV element having:
  - a free layer;
  - a pinned layer;
  - a spacer layer disposed between said free layer and said pinned layer; and
  - a first antiferromagnetic (AFM1) layer for fixing the magnetization of said pinned layer, said pinned layer being disposed on said AFM1 layer;
- first and second hard bias layers separated from each other by said SV element, said first and second hard bias layers forming a contiguous junction with said SV element;
- an insulating layer;
- an asperity compensation layer (ACL) separated from said SV element and said hard bias layers by said insulating layer;
- a second antiferromagnetic (AFM2) layer for fixing the magnetization of said ACL, said ACL disposed on said AFM2 layer;
- first and second SV leads disposed over said first and second hard bias layers for providing sense current to said SV element; and
- first and second ACL leads in contact with said ACL for providing current to said ACL.

13. An SV sensor as recited in claim 12 wherein said free layer is selected from a group of material consisting of NiFe and NiFe/Co.

14. An SV sensor as recited in claim 12 wherein said asperity compensation layer is selected from a group of material consisting of NiFe, NiFe/Co and NiFe/Cu.

15. An SV sensor as recited in claim 12 wherein said AFM1 and AFM2 layers comprise NiO.

16. An SV sensor as recited in claim 12 wherein said first and second hard bias layers are selected from a group of material comprising CoPtCr, CoPtCrTa, and $CoPtCrSiO_2$.

17. A magnetic storage system, comprising:
- a magnetic storage medium for recording data;
- an SV sensor including:
  - an SV element, said SV element having:
    - a free layer;
    - a pinned layer;
    - a spacer layer disposed between said free layer and said pinned layer; and
    - a first antiferromagnetic layer (AFM1) for fixing the magnetization of said pinned layer, said pinned layer being disposed on said AFM1 layer;
  - first and second hard bias layers separated from each other by said SV element, each of said hard bias layers forming a contiguous junction with said SV element;
  - an insulating layer;
  - an asperity compensation layer (ACL) separated from said SV element and said hard bias layers by said insulating layer;
  - a second antiferromagnetic (AFM2) layer for fixing the magnetization of said ACL, said ACL disposed on said AFM2 layer;
  - first and second SV leads disposed over said first and second hard bias layers for providing sense current to said SV element; and
  - first and second ACL leads in contact with said ACL for providing current to said ACL; and
- a recording channel coupled to said SV sensor for detecting resistance changes in said SV element responsive to applied magnetic fields representative of data recorded in said magnetic storage medium.

18. A magnetic storage system according to claim 17, wherein said free layer is selected from a group of material consisting of NiFe and NiFe/Co.

19. A magnetic storage system according to claim 17, wherein said first and second hard bias layers are selected from a group of material consisting of CoPtCr, CoPtCrTa, and $CoPtCrSiO_2$.

20. A magnetic storage system according to claim 17, wherein said asperity compensation layer is selected from a group of material consisting of NiFe, NiFe/Co and NiFe/Cu.

21. A spin valve (SV) sensor, comprising:

an SV element, said SV element having:
- a free layer;
- a pinned layer;
- a spacer layer disposed between said free layer and said pinned layer; and
- an antiferromagnetic (AFM1) layer for fixing the magnetization of said pinned layer, said pinned layer being disposed on said AFM1 layer;

first and second hard bias layers separated from each other by said SV element, said first and second hard bias layers forming a contiguous junction with said SV element;

an insulating layer;

an asperity compensation layer (ACL) separated from said SV element and said hard bias layers by said insulating layer;

first and second SV leads disposed over said first and second hard bias layers for providing sense current to said SV element; and first and second ACL leads in contact with said ACL for providing current to said ACL.

22. An SV sensor as recited in claim 21 wherein said free layer is selected from a group of material consisting of NiFe and NiFe/Co.

23. An SV sensor as recited in claim 21 wherein said ACL is selected from a group of material consisting of NiFe, NiFe/Co, and NiFe/Cu.

24. An SV sensor as recited in claim 23 further comprising an antiferromagnetic (AFM2) layer for fixing the magnetization of said ACL, said ACL disposed on said AFM2 layer.

25. An SV sensor as recited in claim 21 wherein said first and second hard bias layers are selected from a group of material consisting of CoPtCr, CoPtCrTa, and CoPtCrSiO$_2$.

26. An SV sensor as recited in claim 21 wherein said ACL is selected from a group of material consisting of copper and tantalum.

* * * * *